United States Patent
Blomgren et al.

[11] Patent Number: 6,115,294
[45] Date of Patent: *Sep. 5, 2000

[54] METHOD AND APPARATUS FOR MULTI-BIT REGISTER CELL

[75] Inventors: James S. Blomgren; Terence M. Potter; Michael R. Seningen; Stephen C. Horne, all of Austin, Tex.

[73] Assignee: EVSX, Inc, Austin, Tex.

[*] Notice: This patent is subject to a terminal disclaimer.

[21] Appl. No.: 09/291,659

[22] Filed: Apr. 14, 1999

Related U.S. Application Data

[63] Continuation of application No. 09/207,806, Dec. 9, 1998.
[60] Provisional application No. 60/069,250, Dec. 11, 1997.

[51] Int. Cl.[7] ................................................. G11C 7/00
[52] U.S. Cl. .............................. 365/189.02; 365/230.02; 365/194
[58] Field of Search ......................... 365/189.02, 230.02, 365/194, 230.06, 168

[56] References Cited

U.S. PATENT DOCUMENTS

| | | | |
|---|---|---|---|
| 5,497,355 | 3/1996 | Mills et al. ..................... | 365/230.02 X |
| 5,684,744 | 11/1997 | Orgill et al. .................... | 365/189.02 X |
| 5,787,041 | 7/1998 | Hill et al. ........................ | 365/189.02 |
| 5,870,350 | 2/1999 | Berton et al. ................... | 365/230.02 X |
| 5,956,274 | 9/1999 | Elliott et al. .................... | 365/230.02 X |
| 5,963,504 | 10/1999 | Manning ......................... | 365/230.02 X |

*Primary Examiner*—A. Zarabian
*Attorney, Agent, or Firm*—Booth & Wright, L.L.P.; Matthew J. Booth

[57] ABSTRACT

The present invention is a method and apparatus for a register cell that is configured to store more than one bit of information. The cell includes a multiplexer that is configurable to select various inputs when the multiplexer is in various states. The multiplexer is configurable to select a first input when the multiplexer is in a first state, and to select a second input when the multiplexer is in a second state. The multiplexer is further configured to provide multi-bit storage data, the first input being configured to receive multi-bit data from outside the cell. An output element, such as a second multiplexer, is configured to receive a word enable. The output of the first multiplexer is delayed in a delay element, and is provided as one of the inputs to the first multiplexer.

27 Claims, 6 Drawing Sheets

METHOD AND APPARATUS FOR MULTI-BIT REGISTER CELL

This application is a continuation of the earlier filed U.S. Pat. application Ser. No. 09/207,806, filed Dec. 9, 1998, which is incorporated by reference for all purposes into this application. Additionally, this application claims the benefits of the earlier filed US Provisional App. Ser. No. 60/069,250, filed Dec. 11, 1997, which is incorporated by reference for all purposes into this application.

BACKGROUND OF THE INVENTION

1. Field of the Invention

The present invention relates to the field of digital electronics, and more particularly to register cells in digital computer architectures.

2. Description of the Related Art

Most computers, whether sequential or superscalar, have used registers to store data and instructions during execution. An instruction unit within a microprocessor, for example, may receive an opcode to add two values, and then the two values to be added. In response, the instruction unit may store the first value in a particular register, and then add the second number to the contents of the register.

The registers themselves have traditionally been structured much like RAMs, although with far fewer locations. For example, some computers have used either eight or sixteen registers, specified by a three-bit or a four-bit address respectively. Instruction units that use registers, such as arithmetic logic units, typically provide both the data value and/or the register address to the register file.

Each register has typically been implemented as a number of cells, one cell for each bit of the register value. One common implementation of a register file cell has been the six transistor static RAM (SRAM) cell, or "6-T," memory cell. Like RAM cells, each register file cell in a 6-T memory cell contains a pair of pass transistors, gated by a common word line associated with a particular bit of a particular register. Each 6-T memory cell also contains a pair of cross-coupled inverters between two internal nodes, ensuring that one of the nodes has a high voltage and the other node has a low voltage. Additionally, each of the inverters has been implemented as a CMOS transistor pair where each individual pass transistor couples one of the internal nodes to one of the bit lines.

Writing to the register file has typically involved driving the register address onto the word lines within the register file, and driving the bits of the data value onto the bit lines within the register file, much like writing to a RAM. The word lines that receive a high word line voltage enable the corresponding pass transistors, allowing the voltage on the bit lines to flow onto the internal nodes. Similarly, reading from the register file has also typically involved driving the register address onto the word lines within the register file. Reading the bits of the data value from the internal nodes onto the bit lines within the register file is much like reading from a RAM. The word lines that receive a high word line voltage enable the corresponding pass transistors, allowing the voltage on the internal nodes to flow onto the bit lines. In contrast to larger SRAMs, however, register files often have multiple read and write ports to support a higher read/write bandwidth.

Many of the inherent latencies of RAMs are applicable in register files as well. For example, the cross-coupled inverters within each cell are commonly fabricated very small on the die, to allow for greater device density. Consequently, during a read operation, in which bits of the data value from the internal nodes are driven onto bit lines, the small inverters are very weak drivers and have difficulty bringing the voltage on the bit lines to the proper voltage within a reasonable amount of time. Sense amplifiers are used because they detect minute amounts of difference in voltage (or current) on the bit lines, and respond by magnifying that difference.

Sense amplifiers typically have an inherent delay to prevent a response to spurious voltages (such as noise, or residual voltages from previous accesses) on the bit lines. This delay prevents the triggering of the sense amplifier until the voltage on the bit lines is known to relate to the voltage from the desired cell. In some register files, the delay has been implemented with respect to a clock; in other register files, the delay has been implemented with respect to a logical OR of the register address bits. In either case, the delay has added to the latency of the register file. Such delays in register files are even more detrimental to overall performance than delays in RAMs since register files are used on nearly every instruction while memory accesses may not be.

Similar latencies occur in the register files during write operations. A write driver applies a differential voltage onto the bit lines coupled to the cell to drive a bit of the register value as a differential voltage onto the internal nodes of a register cell. However, the bit lines can be quite long, since they are also coupled to the corresponding cell of each of the other registers. Consequently, the bit lines have a capacitance that must be overcome by the bit drivers. Driving the differential voltage past the capacitance of the bit lines adds delay in write operations.

The typical register file for the above prior systems is not optimal for a new logic style known as N-NARY logic. N-NARY logic is disclosed in copending applications, U.S. patent application Ser. No. 09/019,244, filed Feb. 5, 1998, entitled "Method and Apparatus for a N-NARY logic circuit using 1ofN encoding," and U.S. patent application Ser. No. 09/179,330 filed Oct. 27, 1998, entitled "Method and Apparatus for Logic Synchronization," both of which are incorporated by reference into this application. Briefly, the N-NARY logic style uses multiple wires to represent each signal. The value of a signal is determined by selecting one of the wires belonging to the signal. Moreover, each signal contains any number of bits of data, not merely one bit of data. Using a standard register file in an N-NARY logic design would require additional logic to transform the N-NARY signals into bits on a write operation, and then to transform the bits into N-NARY signals on a read operation. The delay cost of such additional logic reduces the performance advantages of the N-NARY logic family.

The present invention addresses the delays inherent in standard register files and also accommodates N-NARY logic signals without the need for the translation logic described above.

SUMMARY

The present invention comprises a method and apparatus for a register cell that is configured to store more than one bit of information. The cell includes a multiplexer that is configurable to select various inputs when the multiplexer is in various states. The multiplexer is configurable to select a first input when the multiplexer is in a first state, and to select a second input when the multiplexer is in a second state. The multiplexer is further configured to provide multi-bit storage data, the first input being configured to receive multi-bit data from outside the cell. An output element, such as a second multiplexer, is configured to receive a word enable. The output of the first multiplexer is delayed in a delay element, and is provided as one of the inputs to the first multiplexer.

BRIEF DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention comprises an N-NARY register file. This disclosure describes numerous specific details that include specific structures, circuits, and logic functions in order to provide a thorough understanding of the present invention. One skilled in the art will appreciate that one may practice the present invention without these specific details.

16-entry Multiported Register File Cells

Figure 1:
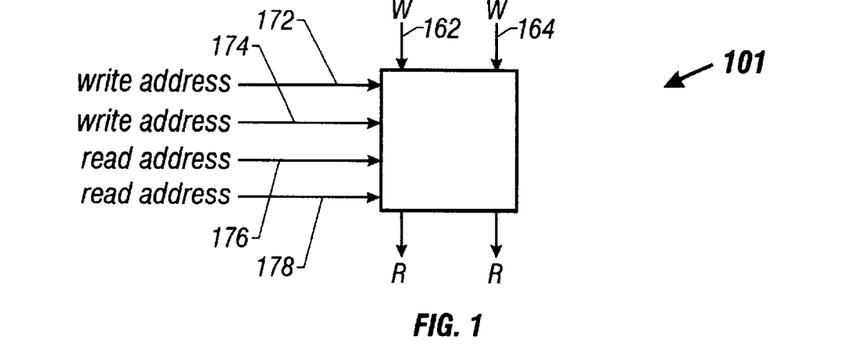
FIG. 1 shows the read and write ports of a 16-entry multiported register file according to both the described embodiment of the present invention and the prior art.

FIG. 1 illustrates the read and write ports of a 16-entry multiported register file 101. A multiported register file typically comprises several registers. Each of the registers comprises a number of cells that are accessed in parallel. For example, each 8-bit register may comprise 8 cells, and each 16-bit register comprises 16 cells. Consequently, if the register file comprises 16 registers, and each register comprises 8 cells, then the register file comprises 16×8, or 128 cells, and each access either writes or reads eight cells. If the register file comprises 16 registers and each register comprises 16 cells, then the register file comprises 256 cells. Registers are also known as entries, and throughout this discussion the terms "register" and "entry" are used interchangeably.

The register file 101 comprises a port 1 write data channel 162 and a port 2 write data channel 164, a port 1 write address channel 172, and a port 2 write address channel 174. The FIG. 1 register file also contains a port 1 read address channel 176, and a port 2 read address channel 178. Each address channel 172–174 is configured to receive a four-bit address identifying one of the sixteen registers. However, an address is only received on an address channel when an access is commanded by the particular port and of the particular type of access indicated by the address channel.

The register file 101 is multiported, which means that multiple ports may access different portions of the register file simultaneously. Multi porting allows greater flexibility in using the register file. For example, the register file has four ports, two for read and two for write access. Consequently, there are four possible uses of the register file (read port 1 or 2, and write port 1 or 2), and accesses may proceed simultaneously as long as write accesses are to different entries. In a multiport register file, rows may be accessed simultaneously by different ports. For example, data may be read from one row and provided to one port, while data may be written to another row by another port. In some designs, data may be written from one port into an entry and simultaneously read on another port. Moreover, if the registers in the register file are 16-bit registers, then the register file has 16 rows and columns. Each register can hold 16 bits, and each bit requires a cell coupled to a pair of bit lines. Each of the columns contains one bit from each register. Therefore, the register file comprises 16×16 or 256 cells.

Figure 2:
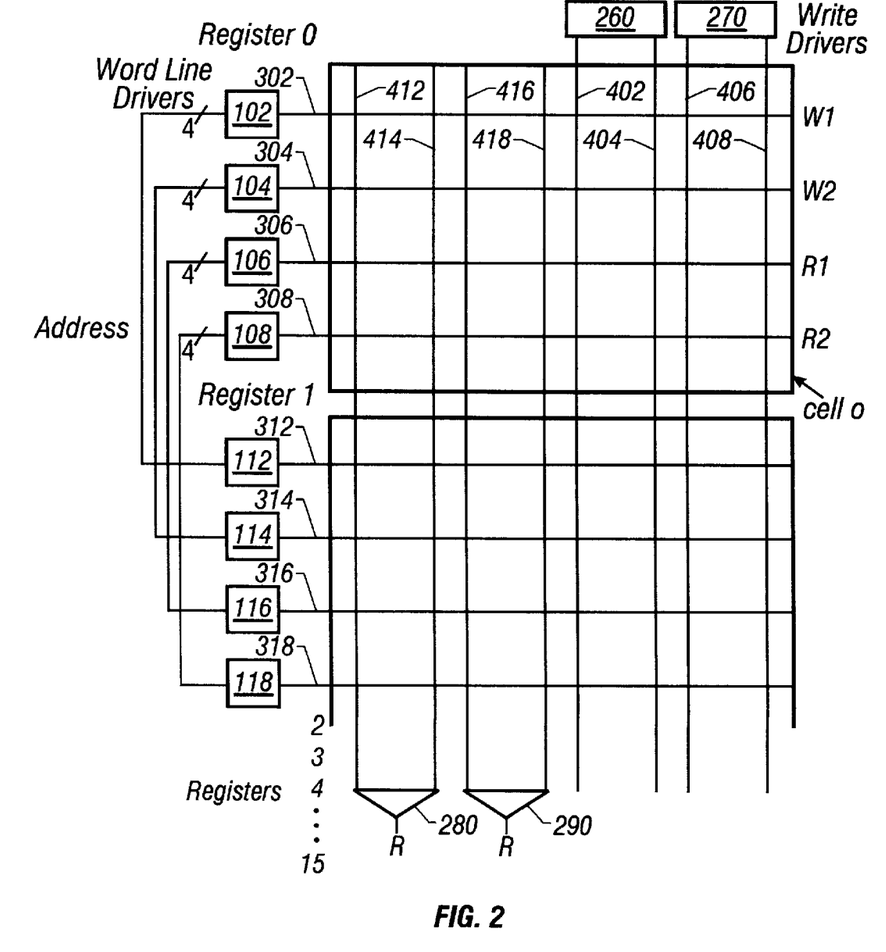
FIG. 2 shows the arrangement of cells within a prior art register file.

FIG. 2 shows the arrangement of cells within a prior art register file. Each cell provides storage for one bit of a register. Like the cells of a RAM, the cells of the register file are arranged in rows and in columns. A word line associated with a particular access of a register by a particular port. For every cell in a register, the pass-transistors gated by a particular word line belong to a row. Each of the 16 registers corresponds to one row and has 4 word lines since there are two ports each allowing two types (read and write) of access. The entire register file has 64 word lines and 16 rows.

Each register has four word line drivers the where word line driver couples to a distinct address channel. In FIG. 2, the word line drivers of Register 0 are designated 102–108. The word line drivers of Register 1 are designated 112–118. Registers 2–15 are not shown in FIG. 2, but are implemented similar to Register 0 and Register 1. Write address channel 172 (of FIG. 1) couples via a decoder (not shown) to word line drivers 102 and 112, as well as to corresponding word line drivers in registers 2–15. Write address channel 174 (of FIG. 1) couples via a decoder (not shown) to word line drivers 104 and 114, as well as to corresponding word line drivers in registers 2–15. When a four-bit address is present on any of the address channels 172–178, the address selects one of the sixteen registers. For example, the address on an address channel may select register 0, identifying word line drivers 102–108. In combination, the address channel and the address select one of word line drivers, such as word line driver 102.

For example, if port 1 write address channel 172 (which couples to word line drivers 102 and 112) carries an address identifying register 0, then word line driver 102 is selected, and word line 302 is asserted. If port 2 write address channel 174 (which couples to word line drivers 104 and 114) carries an address identifying register 0, then word line driver 104 is selected, and word line 304 is asserted. If port 1 read address channel 176 (which couples to word line drivers 106 and 116) carries an address identifying register 0, then word line driver 106 is selected, and word line 306 is asserted. If port 2 write address channel 178 (which couples to word line drivers 108 and 118) carries an address identifying register 0, then word line driver 108 is selected, and word line 308 is asserted.

The register file of FIG. 2 also contains 16 pairs of bit lines for each of the write data channels 162–164. Each pair of bit lines corresponds to one of the 16 columns. The pairs of bit lines may be thought of as perpendicular to the word lines. Each pair of bit lines is connected to one cell in each row, whereas each word line is connected to all of the cells in one row. The cells to which a pair of bit lines is connected form a column. The cells to which a word line is connected form a row. Once a row is selected, all the cells in the row are accessed in parallel.

When a port performs a write access, the port provides write data via a group of write drivers to a group of bit lines.

Each bit of write data is provided via a distinct write driver, such as write driver 260 or 270, to a distinct pair of bit lines. Write driver 260 is connected to provide a bit from port 1 (write data channel 162 of FIG. 1) to bit lines 402 and 404. Write driver 270 is connected to provide a bit from port 2 (write data channel 164 of FIG. 1) to bit lines 406 and 408. Each write driver 260 and 270 is capable of driving a strong differential voltage onto the bit lines, with a polarity determined by the value of the bit.

The register file of FIG. 2 also contains 16 pairs of bit lines for each of the read data channels. When a port performs a read access, the bit lines provide read data via a group of sense amplifiers. Each pair of bit lines provides data to a distinct sense amplifier. Sense amplifier 280 is connected to amplify the differential voltage between bit lines 412 and 414. Sense amplifier 290 is connected to amplify the differential voltage between bit lines 416 and 418.

Figure 3:
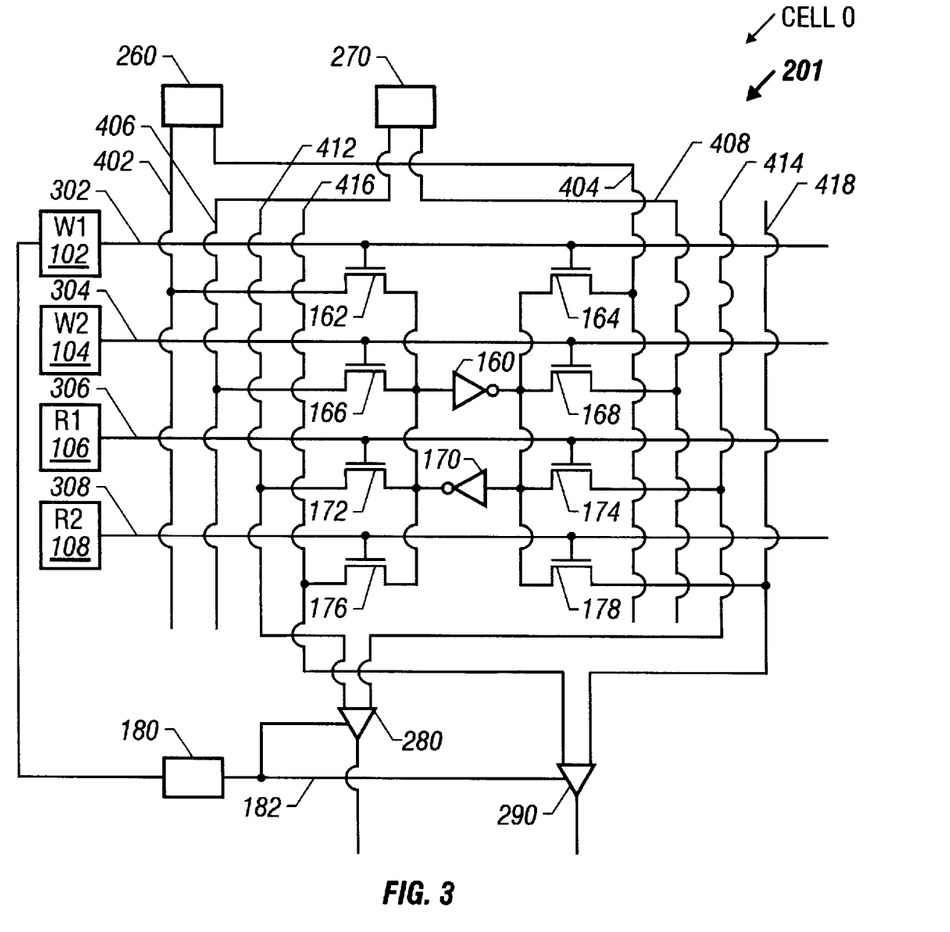
FIG. 3 shows a cell of a prior art register file.

FIG. 3 shows a cell 201 of a prior art register file. During a port 1 write access to the register that includes cell 201, one bit of write data is provided via write driver 260 to the pair of bit lines 402 and 404. During a port 2 write access to the register that includes cell 201, one bit of write data is provided via write driver 270 to the pair of bit lines 406 and 408. During a port 1 read access from the register that includes cell 201, one bit of read data is provided from the pair of bit lines 412 and 414 to sense amplifier 280. During a port 2 read access from the register that includes cell 201, one bit of read data is provided from the pair of bit lines 416 and 418 to sense amplifier 290.

Additionally, cell 201 includes a pair of inverters 160 and 170, pass transistors 162–168 and 172–178, bit lines 402–418, sense amplifiers 280 and 290, and several word lines 302–308 obtained from word line drivers 102–108. The cell also includes a delay 180 providing a SENSE signal to the sense amplifiers 280 and 290.

The word line drivers 102–108 each assert a binary signal on one word line of word lines 302–308. The asserted word line enables a row of cells belonging to the word, by enabling a pair of pass transistors for each cell in the row. The enabled pass transistors allow charge to flow between the cell and the corresponding pair of bit lines.

Several timing problems may arise in the operation of cell 201. Write-access includes a certain amount of delay. Each pair of bit lines extends to an entire column of cells, including one cell of each register. The length of each bit line therefore creates a sizable node capable of storing charge. The capacitive delay associated with the bit line length is one factor in write-access latency. Moreover, any charge on the bit lines travels through the source and drain terminals of the pass transistor. The source and drain terminals of a pass transistor do not provide any amplification, and are typically sized small, reducing the effectiveness of powerful write bit line drivers.

Read-access also includes a certain amount of delay. The voltage is applied to the bit lines by the cells themselves. However, the internal nodes at the terminals of the pair of inverters 160 and 170 have only a limited drive capacity and require time to overcome the capacitive delay of the bit lines. The length of the bit lines and the large number of contacts provide the bit lines with a relatively large capacitance, which prevents instantaneous imposition of charge. Also, if data has previously been stored in the cell, then the bit lines may have a differential voltage already on the bit lines to overcome. More problematic, the pass transistors 172–178 do not provide any voltage amplification, since the signal from the transistor pair is provided to a non-gate terminal of each transistor.

The pair of inverters 160 and 170 is typically fabricated of four transistors according to a CMOS process. CMOS transistors can be very small, providing for as dense a register file as possible. Dense register files can store large amounts of data in a very small space. Small transistors, however, have difficulty driving the bit lines. To drive a charge detectable over the noise margin onto the bit lines therefore requires a discharge time. Sense amplifiers 280 and 290 represent an attempt to minimize the charge delay caused by bit line capacitance and the small size of the CMOS drivers.

During read access initiated by the assertion of word line 306, for example, pass transistors 172 and 174 pass current from the inverter pair 160 and 170, driving a differential voltage onto the bit lines 412 and 414. To allow sufficient charge to accumulate to drive the sense amplifier 280, a SENSE signal 182 is provided by a delay element 180. The delay element 180 prevents triggering of the sense amplifier 280 before the inverter pair 160 and 170 has driven sufficient voltage onto the bit lines 412 and 414. Triggering the sense amplifier 280 early might cause the sense amplifier 280 to respond to noise on the bit lines 412 and 414, or to residual voltage remaining on the bit lines 412 and 414 from a previous access.

Determination of the optimum delay for delay element 180 depends on the capacitance of bit lines 412 and 414, the current available from inverter pair 160 and 170, and the resistance of the pass transistors 172 and 174. Generally, however, bit lines 412 and 414 are long, and the current available from inverter pair 160 and 170 is limited by the size of the CMOS transistors. Uncertainties in the values of these factors typically require adding a margin to the optimum delay.

Moreover, access to the same inverter pair simultaneously by multiple read ports can be problematic register design illustrated in FIG. 3. When port 1 and port 2 both attempt to read the same cell simultaneously, the inverter pair 160 and 170 must drive the differential voltage onto two pairs of bit lines 412–414 and 416–418, possibly exceeding the time margin determined by the delay element 180. When port 1 attempts write access while port 2 attempts read access, timing is even more critical, as it is not immediately evident which value is read by port 2 (the value before being written by port 1 or the value after being written by port 1). A read access therefore effectively prevents writing to the cell until the read access is completed.

N-NARY logic

The multiported register file of the present invention is such that each of the cells allows any port to write or read an N-NARY signal. As previously discussed, an N-NARY signal is implemented on N wires. Consequently, if each register comprises 8 cells and each cell implements a 1-of-4 signal, then each access either writes or reads eight 1-of-4 signals. The present invention is able to accommodate either N-NARY or binary signals.

Figure 4:
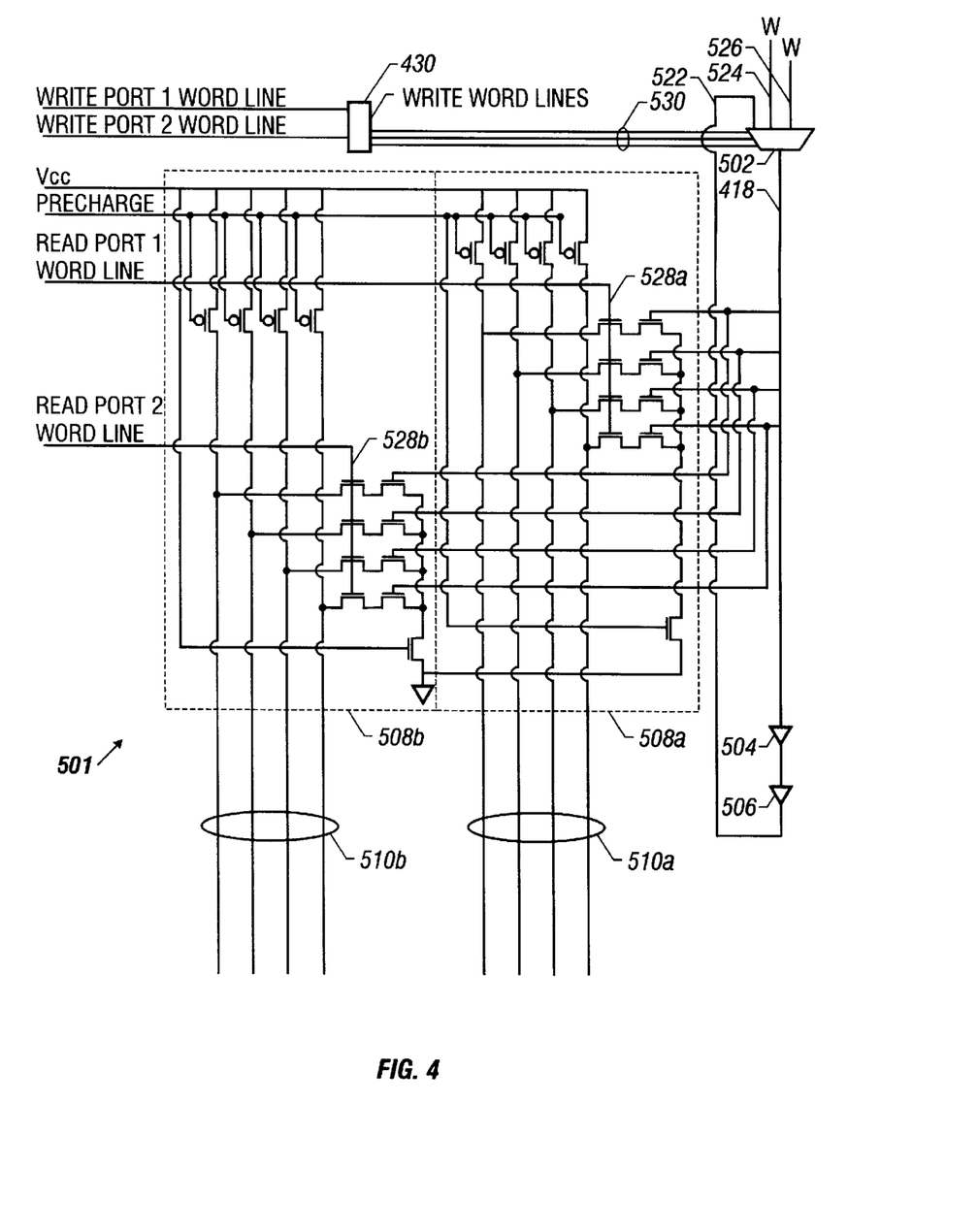
FIG. 4 shows a cell of a register file according to one embodiment of the present invention.

FIG. 4 illustrates a cell 501 of a register file according to one embodiment of the present invention. Cell 501 comprises a multiplexing switch 502, at least one N-NARY delay buffer 504 and 506, a first output multiplexer 508*a*, a second output multiplexer 508*b*, a first N-NARY signal output 510*a*, and a second N-NARY signal output 510*b*. The N-NARY delay buffers 504 and 506 within each cell are coupled in series so that an N-NARY signal propagates through delay buffers 504 and 506 each clock cycle.

The multiplexer 502 combined with the delay buffers 504 and 506 perform the actual storage of information. An N-NARY signal is circulated from the multiplexing switch 502 and through the delay elements 504 and 506 upon every clock cycle when no new N-NARY signal is being written to the cell. When a new N-NARY signal is being written to the cell from one of the write input signals 524 and 526, the new N-NARY signal replaces the N-NARY signal being circulated. Cell 501 is capable of storing an N-NARY signal, not merely one bit as cell 201 of FIG. 3. In other words, the present invention is capable of storing more than one bit of information, or multi-bit information, unlike the prior art. Additionally, the present invention configures the register file as 16 multiplexers and support circuitry, rather than configuring the register file as an array of 256 inverter pairs, bit lines, and sense amplifiers as previously done.

The multiplexing switch 502 is configured to receive an N-NARY signal 524 from a port 1 write driver. The multiplexing switch 502 is also configured to receive an N-NARY signal 526 from a port 2 write driver. When an N-NARY number is represented as a plurality of N-NARY signals, which N-NARY signal the multiplexing switch 502 receives depends on the column in which the cell is located. For example, if the register file is dual-ported, and the cell happens to be in the third column, then regardless of what row the cell is in, the multiplexing switch 502 in the cell is always configured to receive the third N-NARY signal of the write value from each of the two ports. That is to say, all cells in a certain column receive the same pair of input signals 524 and 526.

The multiplexing switch 502 is also configured to receive the output of the last N-NARY delay buffer 506 within the cell. Consequently, the multiplexing switch 502 has one more N-NARY signal input than the register file has write ports. When the register file has two write ports, then the multiplexing switch 502 in each cell receives three N-NARY signals 522, 524, and 526. Additionally, the output multiplexer 502 is a bottom-select multiplexer, selected by the output 418 of the multiplexer 502. The output 418 of multiplexer 502 is provided to the select transistors of the output multiplexer.

Upon each clock cycle, the multiplexing switch 502 selects one of these N-NARY signals 522, 524, and 526. The selection in the multiplexing switch 502 is obtained from an instruction decoder, and depends on whether a write is commanded by the first port, whether a write is commanded from the second port, or whether no write is commanded. When either the first or second port commands a write operation, the multiplexing switch 502 selects the appropriate N-NARY signal from the indicated port. When no write operation is commanded, as for example, when a read operation is performed or when no operation is performed, the multiplexing switch 502 selects the N-NARY signal 522 obtained from the last delay buffer 506 in the series. Once the selection is determined, the multiplexing switch 502 provides the selected N-NARY signal in parallel to the first delay buffer 504, the first output multiplexer 508a, and the second multiplexer output 508b.

The output of the multiplexing switch 502 has two destinations. One destination of the output of the multiplexing switch 502 is the first N-NARY delay buffer 504 in the series of N-NARY delay buffers 504 and 506. Delay buffers 504 and 506 store the contents of the cell. Each of the delay buffers receives the output of the preceding delay buffer. Upon each clock cycle, the contents are passed to the next buffer.

The other destination of the output of the multiplexing switch 502 is the pair of output multiplexers 508a and 508b. The output of the multiplexing switch 502 is known to be an N-NARY signal, and consequently is known to be implemented on several wires, at most one of which carries a high voltage and the others of which carry a low voltage. The output of the multiplexing switch 502 is one of the inputs to multiplexers 508a and 508b.

The other input to the multiplexers 508a and 508b are actually enable signals, represented as read word line 528a and 528b. When read word line 528a is asserted, the output multiplexer 508a passes the N-NARY signal received from the multiplexing switch 502 to output 510a of the output multiplexer 508a. When the read word line 528a is deasserted, however, the N-NARY multiplexer 508a does not drive any of the wires of its N-NARY output 510a signal to a low voltage. Similarly, when read word line 528b is asserted, the output multiplexer 508b passes the N-NARY signal received from the multiplexing switch 502 to output 510b of the output multiplexer 508b. When the read word line 528b is deasserted, however, the N-NARY multiplexer 508a does not drive any of the wires of its N-NARY output 510b signal to a low voltage.

A register file system comprising cell 501 implements each cell within a row and within a column. This register file system includes a 1-of-3 N-NARY signal 530 to each register in the register file. Signal 530 is generated by a write port decoder 500, which receives port 1 address 172 and port 2 address 174. Since each row implements a register, all the cells in the row receive the same signal 530. When a write port commands write access to a particular row, all of the cells in the row receive signal 530 commanding the cells to select one of 3 N-NARY signals: N-NARY signal 524, N-NARY signal 526, or the recirculating signal 522. All other rows receive signal 530 commanding the cells to select another N-NARY signal: either the N-NARY signal from delay buffer 506 or the N-NARY signal from the other port, where each row receives a different signal 530.

Within the register file system, each cell also belongs to a column. When one of the write drivers provides an N-NARY signal 524 or 526, every cell in the column receives the same N-NARY signal 524 or 526. However, only the cell that is in a selected row writes the N-NARY signal. The other cells in the column that are not in the selected row are commanded by signal 530 to circulate N-NARY signal 522.

Multiplexing switch 502 receives the select signal 530 from an instruction decoder. The instruction indicates whether the row comprising the cell is selected, and if so, whether the first write port or the second write port is selected. When the first write port is selected, all the cells in the nth column of the register file receive the nth N-NARY signal 524 from the first write port, and the multiplexing switch 502 of the selected row allows the N-NARY signal 524 to pass to delay buffer 504. When the second write port is selected, all the cells in the nth column of the register file receive the nth N-NARY signal 526 from the second write port, and the multiplexing switch 502 of the selected row allows the N-NARY signal 526 to pass to delay buffer 504.

When signal 530 indicates either write port, the indicated write port will write to the register file. The write port comprises one N-NARY data signal for each column in the register file. For example, if the register file comprises sixteen columns, then each register comprises sixteen cells, and the port writes a value comprising sixteen N-NARY signals to the register file. The value is provided to all rows; however, within any row, each cell receives a distinct N-NARY signal. In other words, the first N-NARY signal in the value is provided to the first cell of each row; the second N-NARY signal in the value is provided to the second cell of each row, and so forth. What a cell receives from a port depends on the column where the cell resides.

The layout illustrated in FIG. 4 provides a pipelined stack of data. Within a very brief amount of time after the multiplexer 502 passes the value of the write data word to the first delay element 504, the multiplexer 502 is ready to accept another data word at the inputs of the multiplexer 502. In other words, cell 501 is actually able to store multiple N-NARY signals simultaneously. There is far less delay after writing data before data may be read from the register file, for example, than in the prior art in which bit lines had to be given time to charge.

Figure 5:
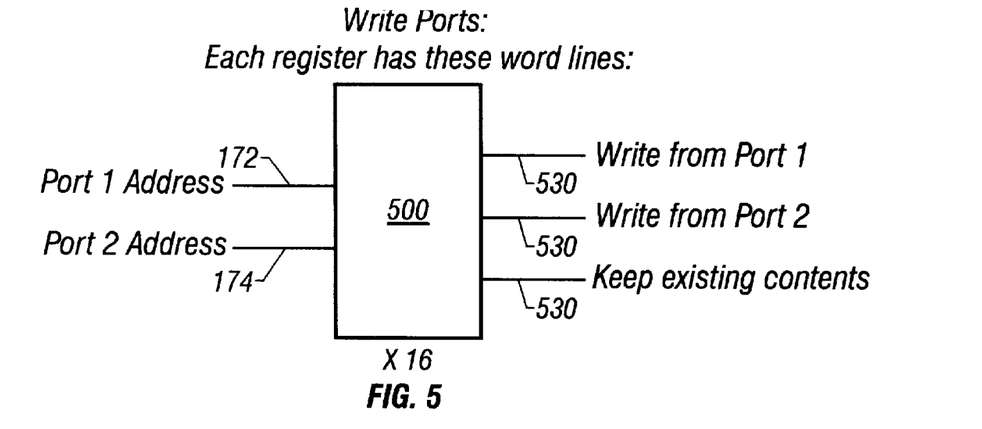
FIG. 5 shows a write word line driver for a single entry.

FIG. 5 shows a write word line driver 500 for a single entry. Each write word line driver 500 receives a port 1 write address and a port 2 write address, decodes each address to determine whether the address identifies the corresponding entry, and provides a 1-of-3 signal upon each clock cycle. The 1-of-3 signal identifies whether either address corresponds to the particular entry.

Figure 6:
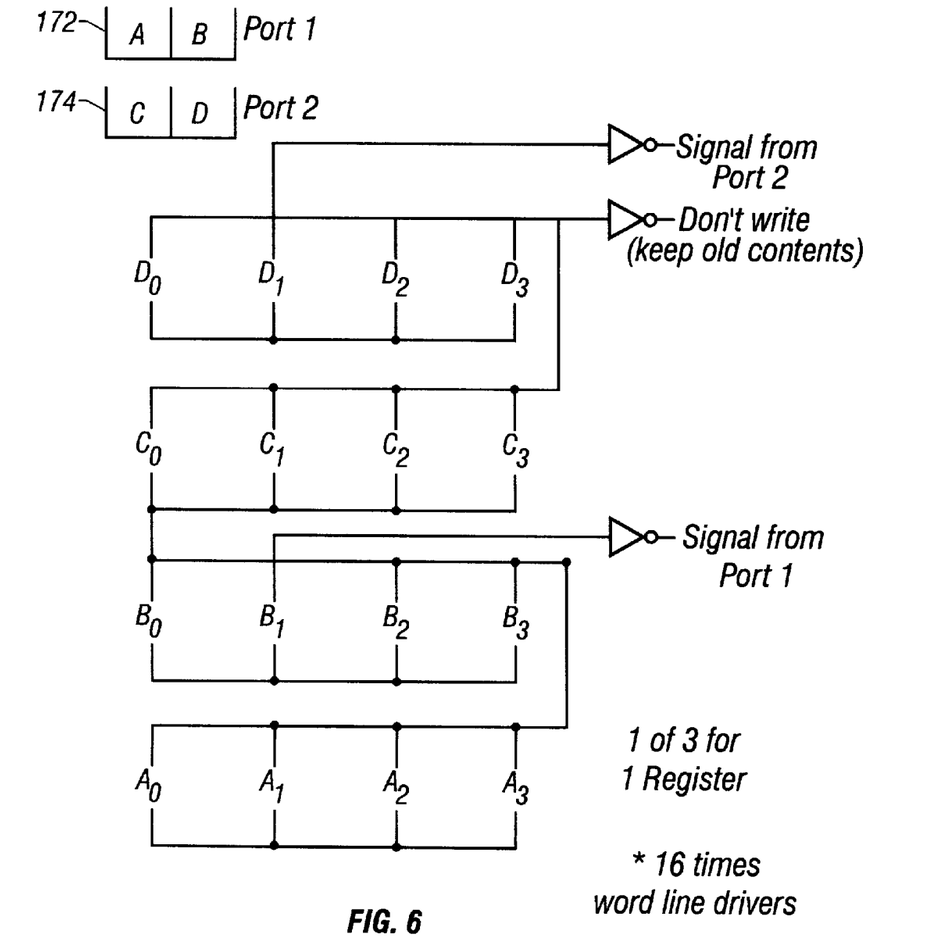
FIG. 6 shows the write word line driver for register 5 of 16 in greater detail.

FIG. 6 shows the write word line driver 500 (of FIG. 5) for a register of the present invention in greater detail. The word line driver 430 (of FIG. 4) receives a port 1 write address, and a port 2 write address. Each write address identifies one of the 16 entries and so is implemented as two 1-of-4 N-NARY signals on 8 physical wires. The two 1-of-4 N-NARY signals encoding port 1 write address are described as A and B, respectively. Similarly, the two 1-of-4 N-NARY signals encoding port 2 write address are described as C and D, respectively. FIG. 6 illustrates the generation of a 1-of-3 signal that identifies whether either address corresponds to this particular entry. In some embodiments, another device, for example a decoder, ensures that both ports do not attempt to write to the same register simultaneously. Note that the circuit in FIG. 6 omits details such as precharge transistors and keeper devices for clarity.

Referring back to FIG. 4, the 1-of-3 signal 530 generated by the write word line decoder 430 and received by the multiplexer 502 as a select signal determines which input to the multiplexer 502 is allowed to circulate. The multiplexer 502 provides its output 418 upon the rising edge of a clock signal, referred to as "phase 1." The first delay element 504 is clocked by a delayed (i.e., phase shifted) version of the same clock signal, referred to as "phase 2" and the second delay element 506 is clocked by a further delayed (i.e., phase shifted) version of the same clock signal, referred to as "phase 3." The clock phases recur at the same frequency, but with different delays. The clock phases are organized so that at no time can all three phases be asserted simultaneously. In other words, at least one clock phase is unasserted at any given time. The phases of the clock signal are described in detail in the Synchronization Patent.

Whenever the phase 3 clock has a rising edge, the write word line drivers 430 generate their 1-of-3 signals in response to the presence or absence of an address at the inputs of the write word line driver 500. Whenever the phase 1 clock has a rising edge, the multiplexer 502 permits the value of the multiplexer output 418 to pass onto the first delay element 504. Whenever the phase 2 clock has a rising edge, the first delay element 504 permits the value of the multiplexer output 418 to pass to the second delay element 506. Whenever the phase 3 clock has a rising edge, the second delay element 506 permits the value of the first delay element 504 to pass back to the multiplexer 502. Thus, the number of inputs to the multiplexer 502 of the entry include one more data word than the number of ports. Each port provides a write data word to the inputs of the multiplexer 502, but a previous value of the multiplexer output 418 is also provided.

Read access to registers is performed more simply in the described embodiment of the present invention than in the prior art. The output signals 510a and 510b comprise wires that are coupled to each cell in the column. The output multiplexers 508a and 508b of each cell in the register file shares output signals with all of the other cells in the column. When a port commands read access from a particular register, the register identified in the read address 176 or read address 178 is transformed by word line decoders into a plurality of read word lines. When port 1 commands read access from a particular register, read port 1 word line 528a is asserted, and output multiplexer 508a provides the N-NARY signal 418 to output signal 510a. When port 2 commands read access from a particular register, read port 2 word line 528b is asserted, and output multiplexer 508b provides the N-NARY signal 418 to output signal 510b.

The timing problems observed during read access of cell 201 of FIG. 3, in which driving multiple outputs required a pair of small CMOS inverters to drive multiple bit lines, are not applicable to cell 501 of FIG. 4. The register file of the present invention more easily drives multiple outputs. Rather than applying a voltage to a drain or source terminal of a pass transistor, as in the prior art cell 201 of FIG. 3, the cell 501 of FIG. 4 of the present invention applies a voltage to the gate terminals of output multiplexers 508a and 508b. Providing a signal to the gate terminal of a transistor creates an inherent amplification. Consequently, the output signals 510a and 510b are able to drive bigger loads than the bit lines of FIG. 3.

Figure 7:
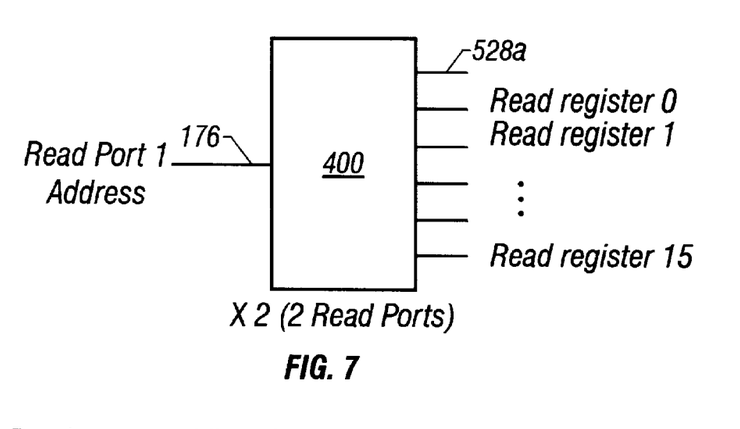
FIG. 7, FIG. 7A, and FIG. 7B show a read word line decoder.
Figure 7A:
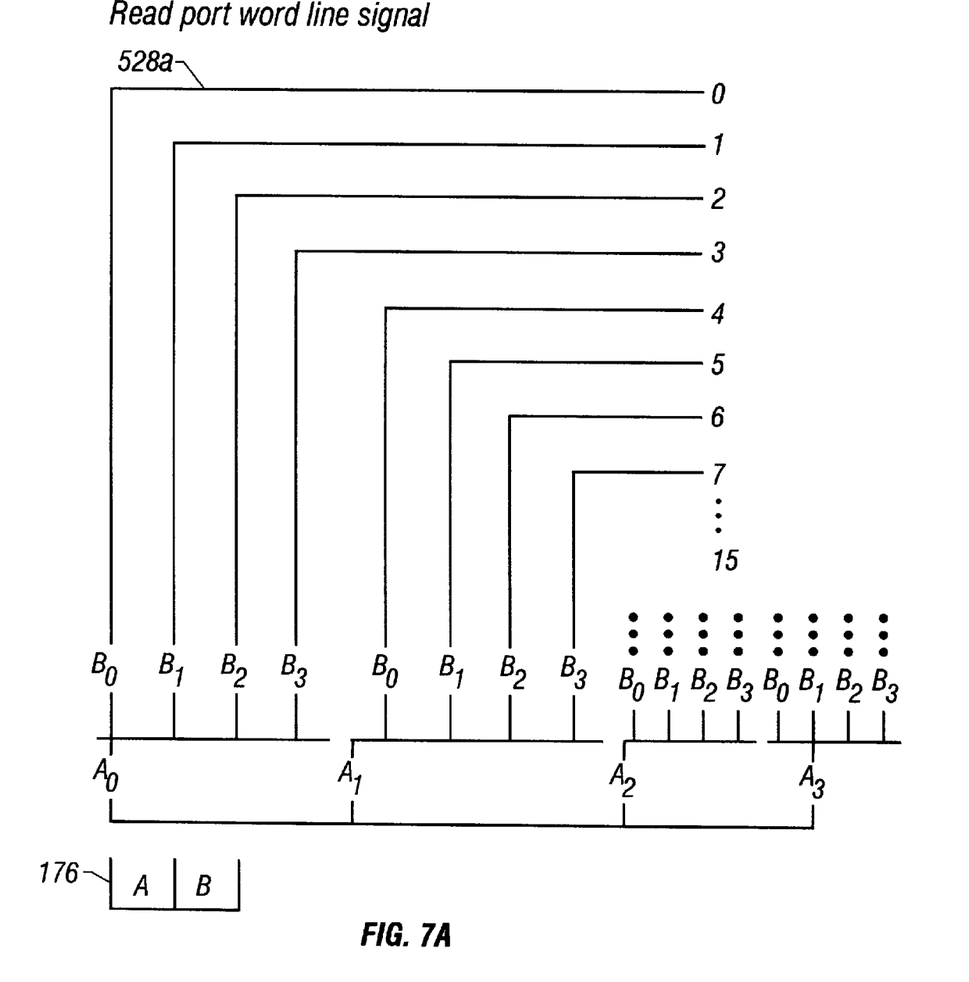
Figure 7B:
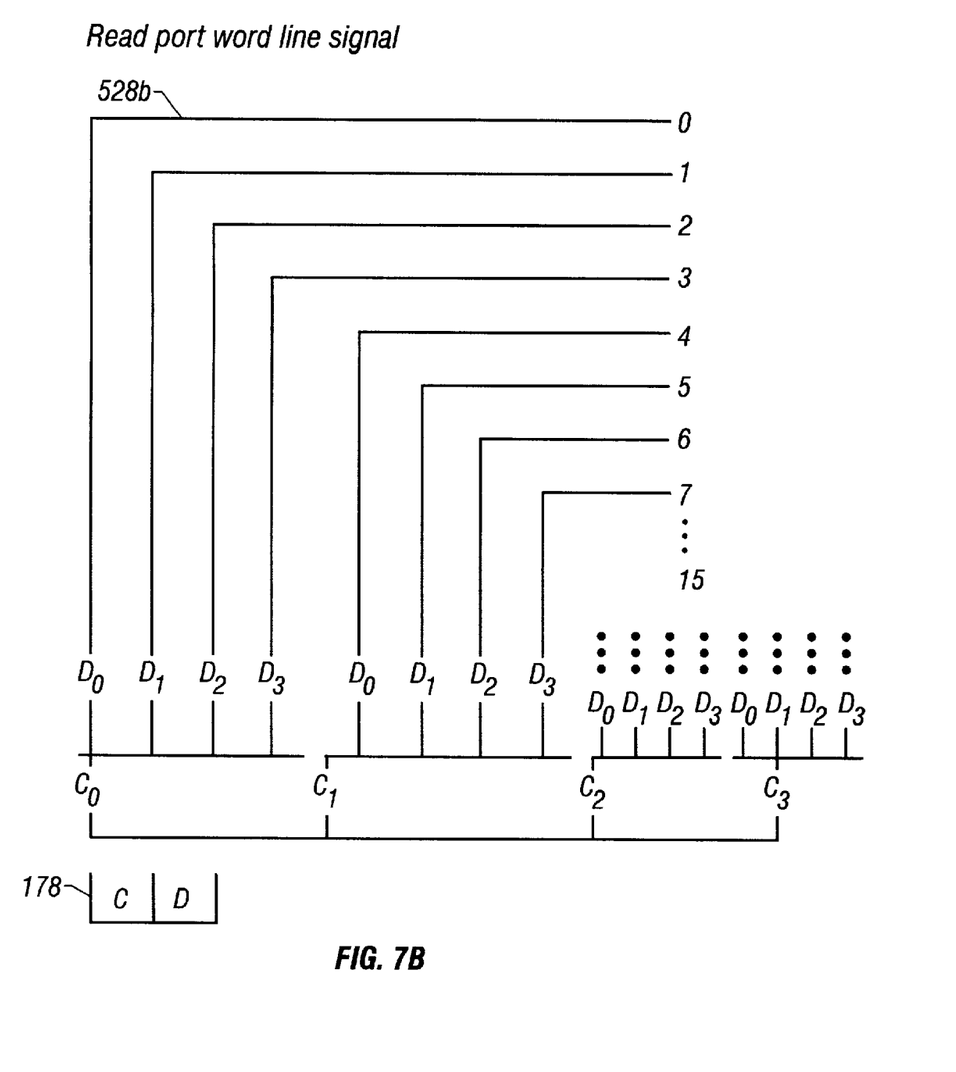

FIG. 7, FIG. 7A, and FIG. 7B illustrate a read word line decoder 400 (not shown in FIG. 4). The read word line decoder 400 associated with each port receives a read address corresponding to the port, and then generates an N-NARY signal having a distinct wire for each entry in the register file. The read word line decoder 400 is shown in greater detail in FIGS. 7A and 7B. The read word line decoder 400 is simply a decoder for generating a 1-of-16 N-NARY signal (there are 16 entries) according to the read word line address.

Each read address identifies one of the 16 entries, and so is implemented as two 1-of-4 N-NARY signals on 8 physical wires. FIG. 7A shows the two 1-of-4 N-NARY signals encoding port 1 read address, described as A and B, respectively. Similarly, FIG. 7B shows the two 1-of-4 N-NARY signals encoding port 2 read address are described as C and D, respectively. FIG. 7A shows the generation of the 1-of-16 signal identifying whether either address corresponds to entry 5 of 16. In some embodiments, another device, for example a decoder, ensures that both ports do not attempt to write to the same register simultaneously.

In summary, the present invention comprises a method and apparatus for a register cell that is configured to store information. The cell includes a multiplexer that is configurable to select various inputs when the multiplexer is in various states. The multiplexer is configurable to select a first input when the multiplexer is in a first state, and to select a second input when the multiplexer is in a second state. The multiplexer is further configured to provide storage data, the first input being configured to receive data from outside the cell. An output element, such as a second multiplexer, is configured to receive a word enable. The output of the first multiplexer is delayed in a delay element, and is provided as one of the inputs to the first multiplexer.

Other embodiments of the invention will be apparent to those skilled in the art after considering this specification or practicing the disclosed invention. The specification and examples above are exemplary only, with the true scope of the invention being indicated by the following claims.

What is claimed is:

1. A register cell that stores more than one bit of information, comprising:
    a first multiplexer configurable to select a first N-NARY input when said first multiplexer is in a first state, and to select a second N-NARY input when said first multiplexer is in a second state, and further configured to provide multi-bit storage data, said first N-NARY input being configured to receive multi-bit data from outside the cell;
    a word input configured to receive a word enable;
    a delay element configured to receive the multi-bit storage data and subsequently to provide the multi-bit storage data to said second N-NARY input of said first multiplexer; and
    an output element configured to receive the multi-bit storage data and, when selected by said word enable, to provide the multi-bit storage data to an output.

2. The register cell of claim 1 further comprising a select input configured to receive a select indicator and to command a state of said first multiplexer, said select indicator being configurable to command said first multiplexer into said first state when said select indicator has a first value and further being configurable to command said first multiplexer into said second state when said select indicator has a second value.

3. The register cell of claim 1 wherein said first multiplexer is configured to receive a plurality of multi-bit signals from a first port when said first multiplexer is in said first state.

4. The register cell of claim 1 wherein said first multiplexer is further configurable to select a third N-NARY input when said first multiplexer is in a third state, said third input being configured to receive multi-bit data from outside the cell.

5. The register cell of claim 1 wherein said output comprises a portion of a second multiplexer configured to receive said multi-bit storage data and, when selected by said word enable, to provide said multi-bit storage data to the output.

6. The register cell of claim 1 further comprising a word line driver configured to receive a first address on a first address channel, said word line driver being coupled to configure said first multiplexer into said first state when said first address is received on said first address channel, and further being coupled to configure said first multiplexer into a state other than said first state when said first address is not received on said first address channel.

7. The register cell of claim 6 wherein said word line driver is further configured to receive a second address on a second address channel, said word line driver being coupled to configure said first multiplexer into said third state when both said first address is not received on said first address channel and said second address is received on said second address channel, and further being coupled to configure said first multiplexer into a state other than said third state when said second address is not received on said second address channel.

8. A register system stores more than one bit of information, comprising:
    a decoder, configured to receive an address on at least one address channel and further configured to generate a select signal in response thereto;
    a first multiplexer coupled to receive said select signal and further being configurable to select a first N-NARY input when said first multiplexer is in a first state and to select a second N-NARY input when said first multiplexer is in a second state, said first multiplexer further being configured to provide multi-bit storage data, said first N-NARY input being configured to receive multi-bit data from outside the system;
    a word input configured to receive a word enable;
    a delay element configured to receive said multi-bit storage data and subsequently to provide the multi-bit storage data to said second N-NARY input of said first multiplexer; and
    an output element configured to receive said multi-bit storage data and, when selected by said word enable, to provide the multi-bit storage data to an output.

9. The system of claim 8 further comprising a select input configured to receive a select indicator from said decoder and to command a state of said first multiplexer, said select indicator being configurable to command said first multiplexer into said first state when said select indicator has a first value and further being configurable to command said first multiplexer into said second state when said select indicator has a second value.

10. The system of claim 8 wherein said first N-NARY input is configured to receive a plurality of multi-bit signals from a first port when said first multiplexer is in said first state.

11. The system of claim 8 wherein said first multiplexer is further configurable to select a third N-NARY input when said first multiplexer is in a third state, said third N-NARY input being configured to receive multi-bit data from outside the system.

12. The system of claim 8 wherein said output element comprises a second multiplexer configured to receive said multi-bit storage data and, when selected by said word enable, to provide the multi-bit storage data to the output.

13. The system of claim 8 further comprising a word line driver configured to receive a first address on a first address channel, said word line driver being coupled to configure said first multiplexer into said first state when said first address is received on said first address channel, and further being coupled to configure said first multiplexer into a state other than said first state when said first address is not received on said first address channel.

14. The system of claim 13 wherein the word line driver is further configured to receive a second address on a second address channel, said word line driver being coupled to configure said first multiplexer into said third state when both said first address is not received on said first address channel and said second address is received on said second address channel, and further being coupled to configure said first multiplexer into a state other than said third state when said second address is not received on said second address channel.

15. A method to use a register cell that stores multi-bit information, comprising:
    selecting an input of a first multiplexer, including selecting a first N-NARY input when said first multiplexer is in a first state, and further including selecting a second N-NARY input when said first multiplexer is in a second state;
    receiving multi-bit storage data from at least one of a plurality of inputs of said first multiplexer, wherein said plurality of inputs comprise the first N-NARY input of said first multiplexer and the second N-NARY input of said first multiplexer;
    receiving a word enable at a word input of an output device;

providing the multi-bit storage data to an output when selected by said word enable; and providing the multi-bit storage data to a second input of said first multiplexer.

16. The method of claim 15 further comprises:

receiving a select indicator; and commanding a state of said first multiplexer, including commanding said first multiplexer into said first state when said select indicator has a first value and further including commanding said first multiplexer into said second state when said select indicator has a second value.

17. The method of claim 15 further comprises receiving a plurality of multi-bit signals from a first port when said first multiplexer is in said first state.

18. The method of claim 15 wherein said plurality of inputs of said first multiplexer further comprise a third N-NARY input of said first multiplexer, said third N-NARY input being configured to receive multi-bit data from outside the cell; and said method further comprises selecting said third N-NARY input when said first multiplexer is in a third state.

19. The method of claim 15, further comprising:

receiving a first address on a first address channel;

configuring said first multiplexer into said first state when said first address is received on said first address channel; and configuring said first multiplexer into a state other than said first state when said first address is not received on said first address channel.

20. The method of claim 19, further comprising:

receiving a second address on a second address channel;

configuring said first multiplexer into said third state when both said first address is not received on said first address channel and said second address is received on said second address channel; and configuring said first multiplexer into a state other than said third state when said second address is not received on said second address channel.

21. A method to make a register cell that stores more than one bit of information, comprising:

configuring a first multiplexer to select a first N-NARY input when said first multiplexer is in a first state, and to select a second N-NARY input when said first multiplexer is in a second state, and further configured to provide multi-bit storage data, said first N-NARY input being configured to receive multi-bit data from outside the cell;

providing a word input configured to receive a word enable;

configuring a delay element to receive said multi-bit storage data and subsequently to provide the multi-bit storage data to said second input of said first multiplexer; and configuring an output element to receive the multi-bit storage data and, when selected by said word enable, to provide the multi-bit storage data to an output.

22. The method of claim 21 further comprises configuring a select input to receive a select indicator and to command a state of said first multiplexer, said select indicator being configurable to command said first multiplexer into said first state when said select indicator has a first value and further being configurable to command said first multiplexer into said second state when said select indicator has a second value.

23. The method of claim 21 further comprises configuring said first multiplexer to receive a plurality of multi-bit data from a first port when said first multiplexer is in said first state.

24. The method of claim 21 further comprises configuring said first multiplexer to select a third N-NARY input when said first multiplexer is in a third state, said third N-NARY input being configured to receive multi-bit data from outside the cell.

25. The method of claim 21 wherein said output element comprises a second multiplexer to receive said multi-bit storage data and, when selected by said word erable, to provide said multi-bit storage data to said output.

26. The method of claim 21 further comprising configuring a word line driver to receive a first address on a first address channel, said word line driver being coupled to configure said first multiplexer into said first state when said first address is received on said first address channel, and further being coupled to configure said first multiplexer into a state other than said first state when said first address is not received on said first address channel.

27. The method of claim 26 further comprising configuring said word line driver to receive a second address on a second address channel, said word line driver being coupled to configure said first multiplexer into said third state when both said first address is not received on said first address channel and said second address is received on said second address channel, and further being coupled to configure said first multiplexer into a state other than said third state when said second address is not received on said second address channel.

* * * * *